(12) United States Patent
Choi

(10) Patent No.: US 10,096,345 B2
(45) Date of Patent: Oct. 9, 2018

(54) SEMICONDUCTOR DEVICES

(71) Applicant: SK hynix Inc., Icheon-si, Gyeonggi-do (KR)

(72) Inventor: Min Seok Choi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/467,360

(22) Filed: Mar. 23, 2017

(65) Prior Publication Data

US 2018/0061474 A1  Mar. 1, 2018

(30) Foreign Application Priority Data

Aug. 23, 2016  (KR) .......................... 10-2016-0106759

(51) Int. Cl.
| | |
|---|---|
| *G11C 7/04* | (2006.01) |
| *G06F 3/06* | (2006.01) |
| *G06F 11/10* | (2006.01) |
| *G11C 11/406* | (2006.01) |
| *G11C 11/4076* | (2006.01) |
| *G11C 11/408* | (2006.01) |
| *G11C 29/52* | (2006.01) |
| *G11C 8/12* | (2006.01) |
| *G11C 29/04* | (2006.01) |

(52) U.S. Cl.
CPC .............. *G11C 7/04* (2013.01); *G06F 3/0619* (2013.01); *G06F 3/0653* (2013.01); *G06F 3/0673* (2013.01); *G06F 11/106* (2013.01); *G06F 11/1068* (2013.01); *G11C 11/408* (2013.01); *G11C 11/4076* (2013.01); *G11C 11/40615* (2013.01); *G11C 29/52* (2013.01); *G11C 8/12* (2013.01); *G11C 2029/0409* (2013.01); *G11C 2029/0411* (2013.01)

(58) Field of Classification Search
CPC ............................. G11C 7/04; G11C 11/40626
See application file for complete search history.

(56) References Cited

U.S. PATENT DOCUMENTS

| | | | | |
|---|---|---|---|---|
| 5,355,342 A | * | 10/1994 | Ueoka ................... | G11C 29/28 365/201 |
| 5,726,994 A | * | 3/1998 | Matsuura ............... | G11C 29/18 365/201 |

(Continued)

FOREIGN PATENT DOCUMENTS

KR  1020120136674 A  12/2012

*Primary Examiner* — Steve N Nguyen
(74) *Attorney, Agent, or Firm* — William Park & Associates Ltd.

(57) ABSTRACT

A semiconductor device includes a bank address generation circuit, a row/column address generation circuit, and an operation control circuit. The bank address generation circuit generates a bank address signal according to a bank group selection signal which is generated in response to a first temperature code and a second temperature code. The row/column address generation circuit generates a row address signal and a column address signal according to an area selection signal which is generated in response to a third temperature code and a fourth temperature code. The operation control circuit performs a data scrub operation on a cell which is accessed by the bank address signal, the row address signal and the column address signal.

17 Claims, 8 Drawing Sheets

(56) References Cited

U.S. PATENT DOCUMENTS

| | | | |
|---|---|---|---|
| 7,802,157 B2* | 9/2010 | Pekny | G01R 31/31701 714/718 |
| 9,165,668 B1* | 10/2015 | Zhao | G11C 16/3418 |
| 9,640,242 B1* | 5/2017 | Lo | G11C 11/40618 |
| 2006/0280012 A1* | 12/2006 | Perner | G11C 7/04 365/212 |
| 2010/0005219 A1* | 1/2010 | Loughner | G11O 5/04 711/5 |
| 2013/0318418 A1* | 11/2013 | Bedeschi | G06F 11/1048 714/758 |
| 2014/0059405 A1* | 2/2014 | Syu | G11C 16/349 714/773 |
| 2014/0369110 A1* | 12/2014 | Cho | G11C 7/04 365/149 |
| 2015/0006998 A1* | 1/2015 | Cordero | G06F 11/106 714/773 |
| 2015/0169398 A1 | 6/2015 | Chunn et al. | |
| 2016/0064063 A1* | 3/2016 | Nomura | G11C 11/40618 365/51 |
| 2016/0155491 A1* | 6/2016 | Roberts | G11C 11/40607 711/106 |
| 2017/0126249 A1* | 5/2017 | Wu | H03M 13/05 |

* cited by examiner

SEMICONDUCTOR DEVICES

CROSS-REFERENCE TO RELATED APPLICATIONS

The present application claims priority under 35 U.S.C. § 119(a) to Korean Application No. 10-2016-0106759, filed on Aug. 23, 2016, which is incorporated herein by reference in its entirety.

BACKGROUND

1. Technical Field

Embodiments of the present disclosure relate to semiconductor devices which perform a data scrub operation.

2. Related Art

Each of semiconductor devices such as dynamic random access memory (DRAM) devices may be designed to include a plurality of memory cells, and each of the memory cells may be configured to include a single transistor (also, referred to as a cell transistor) and a single capacitor (also, referred to as a cell capacitor). Data retention characteristics of the DRAM cell may be very sensitive to temperature. Thus, it may be necessary to control an operation condition of circuit blocks in a semiconductor system according to variation of an internal temperature of a semiconductor device employed in the semiconductor system. Temperature sensors such as digital temperature sensor regulators (DTSRs) or analog temperature sensor regulators (ATSRs), or design schemes such as digital temperature compensated self-refresh (DTCSR) techniques have been widely used to control the operation conditions of semiconductor devices such as DRAM devices according to variation of the surrounding temperature.

SUMMARY

According to an embodiment, a semiconductor device includes a bank address generation circuit, a row/column address generation circuit, and an operation control circuit. The bank address generation circuit generates a bank address signal according to a bank group selection signal which is generated in response to a first temperature code and a second temperature code. The row/column address generation circuit generates a row address signal and a column address signal according to an area selection signal which is generated in response to a third temperature code and a fourth temperature code. The operation control circuit performs a data scrub operation on a cell which is accessed by the bank address signal, the row address signal, and the column address signal.

According to another embodiment, a semiconductor device includes a row/column address generation circuit and an operation control circuit. The row/column address generation circuit generates a row address signal and a column address signal according to an area selection signal which is generated in response to a first temperature code and a second temperature code and according to a refresh signal. The operation control circuit performs a data scrub operation on a cell which is accessed by a bank address signal, the row address signal, and the column address signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
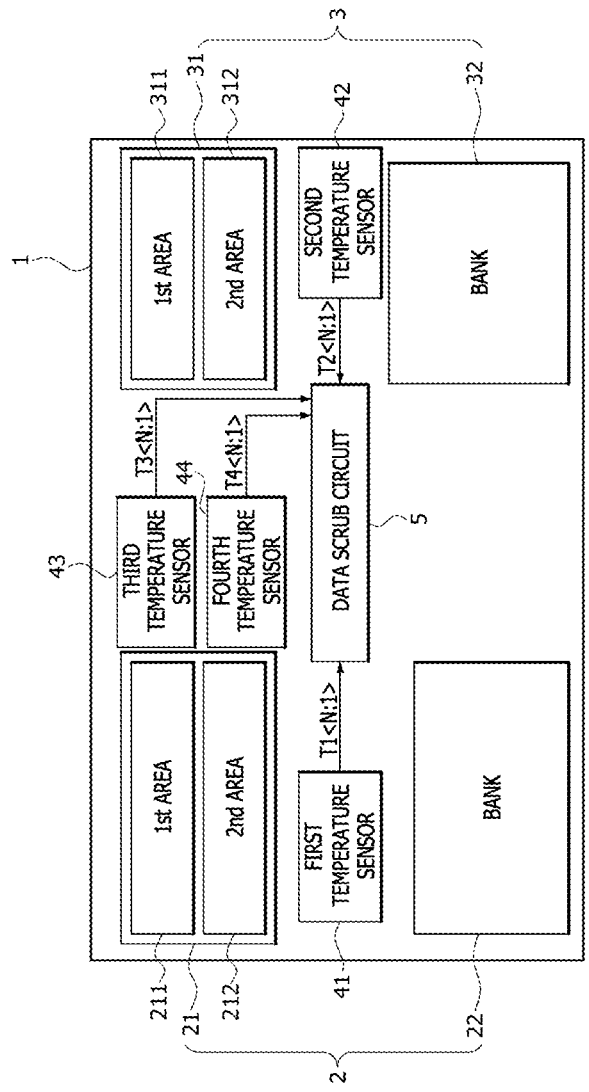
FIG. 1 is a block diagram illustrating a configuration of a semiconductor device according to an embodiment of the present disclosure.

As illustrated in FIG. 1, a semiconductor device 1 according to an embodiment of the present disclosure may include a first bank group 2 and a second bank group 3. The first bank group 2 may include a first bank 21 and a second bank 22. The first bank 21 may include a first area 211 and a second area 212. The second bank group 3 may include a third bank 31 and a fourth bank 32. The third bank 31 may include a first area 311 and a second area 312. The semiconductor device 1 may include a first temperature sensor 41, a second temperature sensor 42, a third temperature sensor 43, a fourth temperature sensor 44, and a data scrub circuit 5.

The first temperature sensor 41 may sense an internal temperature of the first bank group 2 by sensing a temperature between the first bank 21 and the second bank 22 to generate first temperature codes T1<N:1>, where first temperature codes T1<N:1> may include one or more first temperature code T1. Various logic level combinations of the first temperature codes T1<N:1> may correspond to predetermined internal temperatures between the first bank 21 and the second bank 22, respectively. The second temperature sensor 42 may sense an internal temperature of the second bank group 3 by sensing a temperature between the third bank 31 and the fourth bank 32 to generate second temperature codes T2<N:1>, where second temperature codes T2<N:1> may include one or more second temperature code T2. Various logic level combinations of the second temperature codes T2<N:1> may correspond to predetermined internal temperatures between the third bank 31 and the fourth bank 32, respectively. The third temperature sensor 43 may sense an internal temperature between the first area 211 of the first bank 21 and the first area 311 of the third bank 31 to generate third temperature codes T3<N:1>, where the third temperature codes T3<N:1> may include one or more third temperature code T3. Various logic level combinations of the third temperature codes T3<N:1> may correspond to predetermined internal temperatures between the first area 211 of the first bank 21 and the first area 311 of the third bank 31, respectively. The fourth temperature sensor 44 may sense an internal temperature between the second area 212 of the first bank 21 and the second area 312 of the third bank 31 to generate fourth temperature codes T4<N:1>, where the fourth temperature codes T4<N:1> may include one or more fourth temperature code T4. Various logic level combinations of the fourth temperature codes T4<N:1> may correspond to predetermined internal temperatures between the second area 212 of the first bank 21 and the second area 312 of the third bank 31, respectively.

The data scrub circuit 5 may control a data scrub operation on the first bank 21, the second bank 22, the third bank 31, and the fourth bank 32, in response to the first temperature codes T1<N:1>, the second temperature codes T2<N:1>, the third temperature codes T3<N:1>, and the fourth temperature codes T4<N:1>. The data scrub circuit 5 may perform the data scrub operation on the first bank group 2 or the data scrub circuit 5 may perform the data scrub operation on the second bank group 3, in response to the first temperature codes T1<N:1> and the second temperature codes T2<N:1>. For example, the data scrub circuit 5 may perform the data scrub operation on the first bank group 2, if an internal temperature corresponding to the first temperature codes T1<N:1> is higher than an internal temperature corresponding to the second temperature codes T2<N:1>. Alternatively, the data scrub circuit 5 may perform the data scrub operation on the second bank group 3, if an internal temperature corresponding to the first temperature codes T1<N:1> is lower than an internal temperature corresponding to the second temperature codes T2<N:1>. The data scrub circuit 5 may perform the data scrub operation on the first area 211 of the first bank 21 and the first area 311 of the third bank 31 or the data scrub circuit 5 may perform the data scrub operation on the second area 212 of the first bank 21 and the second area 312 of the third bank 31, in response to the third temperature codes T3<N:1> and the fourth temperature codes T4<N:1>. For example, the data scrub circuit 5 may perform the data scrub operation on the first area 211 of the first bank 21 and the first area 311 of the third bank 31, if an internal temperature corresponding to the third temperature codes T3<N:1> is higher than an internal temperature corresponding to the fourth temperature codes T4<N:1>. Alternatively, the data scrub circuit 5 may perform the data scrub operation on the second area 212 of the first bank 21 and the second area 312 of the third bank 31, if an internal temperature corresponding to the third temperature codes T3<N:1> is lower than an internal temperature corresponding to the fourth temperature codes T4<N:1>.

In the present embodiment, the first bank 21 and the third bank 31 may be spaced apart from each other in a horizontal direction when viewed from a plan view corresponding to the block diagram of FIG. 1, and each of the first bank 21 and the third bank 31 may be divided into two areas in a vertical direction intersecting the horizontal direction. In such a case, the third temperature sensor 43 may be disposed between the first area 211 of the first bank 21 and the first area 311 of the third bank 31 to sense the internal temperature between the first areas 211 and 311. The fourth temperature sensor 44 may be disposed between the second area 212 of the first bank 21 and the second area 312 of the third bank 31 to sense the internal temperature between the second areas 212 and 312. In some embodiments, each bank may be divided into three or more areas, and three or more temperature sensors may be disposed between two adjacent banks to sense the internal temperatures between the two adjacent banks. In some other embodiments, each of the first bank 21 and the second bank 22 may be divided into at least two areas in the horizontal direction, and at least two temperature sensors may be disposed between the first bank 21 and the second bank 22 to sense the internal temperatures between the first bank 21 and the second bank 22.

Figure 2:
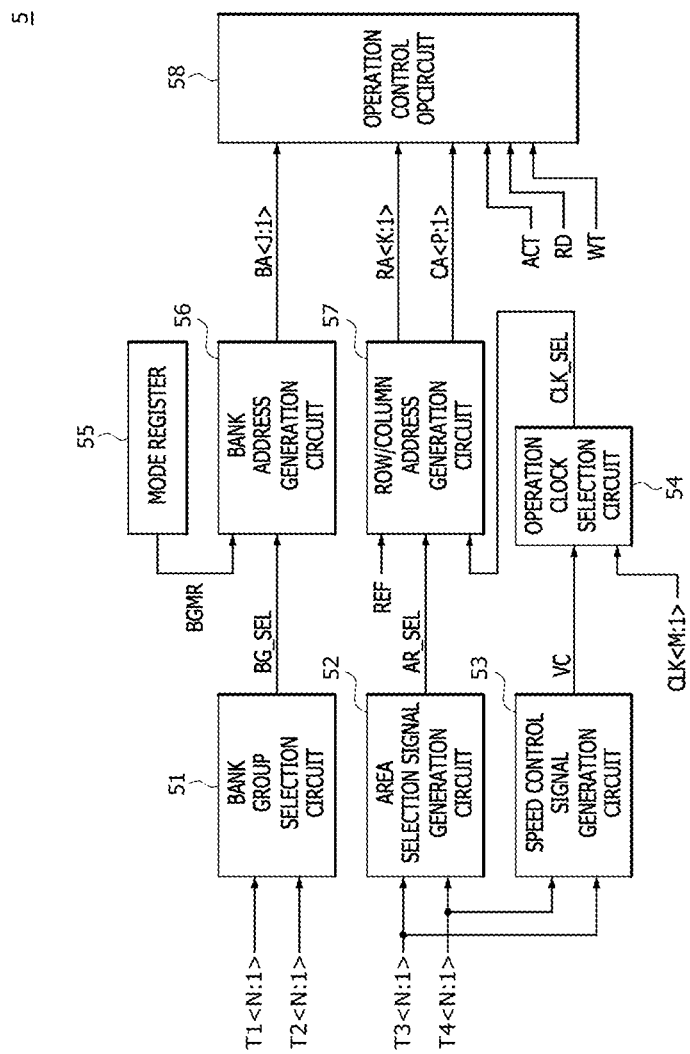
FIG. 2 is a block diagram illustrating a configuration of a data scrub circuit included in the semiconductor device of FIG. 1.

As illustrated in FIG. 2, the data scrub circuit 5 may include a bank group selection circuit 51, an area selection signal generation circuit 52, a speed control signal generation circuit 53, an operation clock selection circuit 54, a mode register 55, a bank address generation circuit 56, a row/column address generation circuit 57, and an operation control circuit 58.

The bank group selection circuit 51 may generate a bank group selection signal BG_SEL for selecting one of the first bank group 2 and the second bank group 3 that performs the data scrub operation, in response to the first temperature codes T1<N:1> and the second temperature codes T2<N:1>. The bank group selection circuit 51 may generate the bank group selection signal BG_SEL having a logic low level so as to perform the data scrub operation on the first bank group 2, if the internal temperature corresponding to the first temperature codes T1<N:1> is higher than the internal temperature corresponding to the second temperature codes T2<N:1>. The bank group selection circuit 51 may generate the bank group selection signal BG_SEL having a logic high level so as to perform the data scrub operation on the second bank group 3, if the internal temperature corresponding to the first temperature codes T1<N:1> is lower than the internal temperature corresponding to the second temperature codes T2<N:1>. A logic level combination of the bank group selection signal BG_SEL which is set to perform the data scrub operation on the first bank group 2 or the second bank group 3 may be set to be different according to the embodiment.

The area selection signal generation circuit 52 may generate an area selection signal AR_SEL for selecting areas where the data scrub operation is performed among the first area 211 of the first bank 21, the first area 311 of the third bank 31, the second area 212 of the first bank 21, and the second area 312 of the third bank 31, in response to the third temperature codes T3<N:1> and the fourth temperature codes T4<N:1>. The area selection signal generation circuit 52 may generate the area selection signal AR_SEL having a logic low level to perform a data scrub operation on the first area 211 of the first bank 21 and the first area 311 of the third bank 31, if the internal temperature corresponding to the third temperature codes T3<N:1> is higher than the internal temperature corresponding to the fourth temperature codes T4<N:1>. The area selection signal generation circuit 52 may generate the area selection signal AR_SEL having a logic high level to perform the data scrub operation on the second area 212 of the first bank 21 and the second area 312 of the third bank 31, if the internal temperature corresponding to the third temperature codes T3<N:1> is lower than the internal temperature corresponding to the fourth temperature codes T4<N:1>. A logic level combination of the area selection signal AR_SEL for selecting an area in which the data scrub operation is performed among the first areas 211 and 311 and the second areas 212 and 312 may be set to be different according to the embodiments.

The speed control signal generation circuit 53 may generate a speed control signal VC for determining a frequency of an operation clock signal CLK_SEL in response to the third temperature codes T3<N:1> and the fourth temperature codes T4<N:1>. The speed control signal generation circuit 53 may generate the speed control signal VC having a logic low level, if at least one internal temperature corresponding to the third temperature codes T3<N:1> and the internal temperature corresponding to the fourth temperature codes T4<N:1> is lower than a predetermined internal temperature. The speed control signal generation circuit 53 may generate the speed control signal VC having a logic high level, if at least one of the internal temperature corresponding to the third temperature codes T3<N:1> and the internal temperature corresponding to the fourth temperature codes T4<N:1> is higher than the predetermined internal temperature. In some embodiments, the speed control signal VC may be set to have multiple bits and may be set to have various logic level combinations corresponding to various temperature sections.

The operation clock selection circuit 54 may generate the operation clock signal CLK_SEL from a clock signal CLK<M:1> in response to the speed control signal VC. The operation clock selection circuit 54 may select a frequency of the operation clock signal CLK_SEL in synchronization with the clock signal CLK<M:1> according to a logic level of the speed control signal VC. For example, the operation clock selection circuit 54 may select and output a first bit CLK<1> of the clock signal having a first frequency as the operation clock signal CLK_SEL if the speed control signal VC has a logic low level, and the operation clock selection circuit 54 may select and output a second bit CLK<2> of the clock signal having a second frequency as the operation clock signal CLK_SEL if the speed control signal VC has a logic high level. The number of frequencies of the operation clock signal CLK_SEL which can be selected by the operation clock selection circuit 54 may be set to be three or more according to the embodiment.

The mode register 55 may include bank information BGMR. The mode register 55 may store the bank information BGMR by performing a mode register set (MRS) operation. The mode register 55 may write the bank information BGMR therein in response to a mode register write command signal, and the mode register 55 may output the bank information BGMR stored therein in response to a mode register read command signal. The bank information BGMR may include information on the banks in which the data scrub operation is performed. For example, the data scrub operation on the first bank group 2 or the second bank group 3 may be performed if the bank information BGMR has a logic low level, and the data scrub operation on the first bank 21 or the third bank 31 may be performed if the bank information BGMR has a logic high level. In some embodiments, the bank information BGMR may be set to include multiple bits. The banks in which the data scrub operation is performed according to the bank information BGMR may be set to be different according to the embodiment.

The bank address generation circuit 56 may generate bank address signals BA<J:1> in response to at least one of the bank information BGMR and the bank group selection signal BG_SEL, where the bank address signals BA<J:1> may include one or more bank address signal BA. The bank address generation circuit 56 may generate the bank address signals BA<J:1> corresponding to at least one bank of the first bank 21, the second bank 22, the third bank 31, and the fourth bank 32, according to a logic level combination of the bank information BGMR and the bank group selection signal BG_SEL. The bank address generation circuit 56 may generate the bank address signals BA<J:1> corresponding to the first bank group 2 including the first bank 21 and the second bank 22, if both of the bank information BGMR and the bank group selection signal BG_SEL have a logic low level. The bank address generation circuit 56 may generate the bank address signals BA<J:1> corresponding to the first bank 21 of the first bank group 2, if at least one of the bank information BGMR has a logic high level and the bank group selection signal BG_SEL has a logic low level. The bank address generation circuit 56 may generate the bank address signals BA<J:1> corresponding to the second bank group 3 including the third bank 31 and the fourth bank 32, if the bank information BGMR has a logic low level and the bank group selection signal BG_SEL has a logic high level. The bank address generation circuit 56 may generate the bank address signals BA<J:1> corresponding to the third bank 31 of the second bank group 3, if at least one of the bank information BGMR and the bank group selection signal BG_SEL have a logic high level.

The row/column address generation circuit 57 may generate row address signals RA<K:1> and column address signals CA<P:1> corresponding to at least one area of the first area 211 of the first bank 21, the first area 311 of the third bank 31, the second area 212 of the first bank 21, and the second area 312 of the third bank 31, in response to at least one of the operation clock signal CLK_SEL, a refresh signal REF, and the area selection signal AR_SEL. The row address signals RA<K:1> and column address signals CA<P:1> may include one or more row address signal RA or column address signal CA. The row/column address generation circuit 57 may generate the row address signals RA<K:1> and the column address signals CA<P:1> corresponding to the first area 211 of the first bank 21 or the first area 311 of the third bank 31 or the row/column address generation circuit 57 may generate the row address signals RA<K:1> and the column address signals CA<P:1> corresponding to the second area 212 of the first bank 21 or the second area 312 of the third bank 31, according to a logic level of the area selection signal AR_SEL in response to the refresh signal REF that is enabled to perform an refresh operation. The row/column address generation circuit 57 may generate the row address signals RA<K:1> and the column address signals CA<P:1> at an operation speed which is selected by a frequency of the operation clock signal CLK_SEL.

The operation control circuit 58 may perform the data scrub operation on a cell which is accessed by the bank address signals BA<J:1>, the row address signals RA<K:1>, and the column address signals CA<P:1>, in response to an active signal ACT, a read signal RD, and a write signal WT. The operation control circuit 58 may perform an active operation and a read operation on the cell which is accessed by the bank address signals BA<J:1>, the row address signals RA<K:1>, and the column address signals CA<P:1> to determine whether data stored in the cell has an error and the operation control circuit 58 may perform the data scrub operation for writing errorless data into the cell using a write operation if the data has an error. The operation control circuit 58 may include a circuit necessary for the data scrub operation.

The semiconductor device according to the present embodiment may perform the data scrub operation using the third temperature sensor 43 and the fourth temperature sensor 44 disposed between the first bank 21 and the third bank 31 without having any temperature sensor between the second bank 22 and the fourth bank 32. Hence, the bank information BGMR may be set to have a logic high level so that only the row address signals RA<K:1> and the column address signals CA<P:1> for performing the data scrub operation on the first bank 21 and the third bank 31 are generated. In some embodiments, temperature sensors may be provided between the second bank 22 and the fourth bank 32. In such a case, the bank information BGMR may be set to have a logic low level. If the bank information BGMR is set to have a logic low level, the row address signals RA<K:1> and the column address signals CA<P:1> for performing the data scrub operation on the second bank 22 and the fourth bank 32 may be generated.

Figure 3:
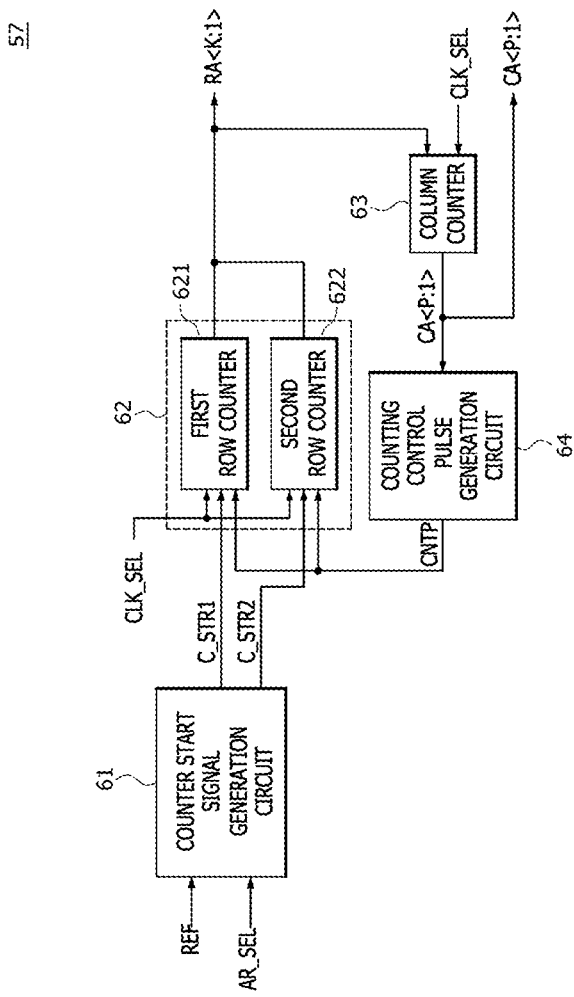
FIG. 3 is a block diagram illustrating a configuration of a row/column address generation circuit included in the data scrub circuit of FIG. 2.

Referring to FIG. 3, the row/column address generation circuit 57 may include a counter start signal generation circuit 61, a row counter circuit 62, a column counter 63, and a counting control pulse generation circuit 64. The row counter circuit 62 may include a first row counter 621 and a second row counter 622.

The counter start signal generation circuit 61 may generate a first counter start signal C_STR1 and a second counter start signal C_STR2 in response to the refresh signal REF and the area selection signal AR_SEL. The counter start signal generation circuit 61 may generate the first counter start signal C_STR1 and the second counter start signal C_STR2, one of which is selectively enabled according to a logic level of the area selection signal AR_SEL, while the refresh signal REF is enabled to perform the refresh operation. The counter start signal generation circuit 61 may generate the first counter start signal C_STR1 which is enabled if the refresh operation is performed while the area selection signal AR_SEL has a logic low level. The counter start signal generation circuit 61 may generate the second counter start signal C_STR2 which is enabled if the refresh operation is performed while the area selection signal AR_SEL has a logic high level.

The first row counter 621 may output the row address signals RA<K:1> that are counted in response to at least one of the first counter start signal C_STR1, a counting control pulse CNTP, and the operation clock signal CLK_SEL. The first row counter 621 may set a logic level combination of the row address signals RA<K:1> to a first initial logic level combination in synchronization with a point of time that the first counter start signal C_STR1 is enabled. The first initial logic level combination of the row address signals RA<K:1> may correspond to a first word line included in the first area 211 of the first bank 21 or a first word line included in the first area 311 of the third bank 31. The first row counter 621 may sequentially count the row address signals RA<K:1> from the first initial logic level combination to a first end logic level combination in synchronization with the operation clock signal CLK_SEL, if the counting control pulse CNTP occurs. The first end logic level combination of the row address signals RA<K:1> may correspond to a final word line included in the first area 211 of the first bank 21 or a final word line included in the first area 311 of the third bank 31.

The second row counter 622 may output the row address signals RA<K:1> that are counted in response to at least one of the second counter start signal C_STR2, the counting control pulse CNTP, and the operation clock signal CLK_SEL. The second row counter 622 may set a logic level combination of the row address signals RA<K:1> to a second initial logic level combination in synchronization with a point of time that the second counter start signal C_STR2 is enabled. The second initial logic level combination of the row address signals RA<K:1> may correspond to a first word line included in the second area 212 of the first bank 21 or a first word line included in the second area 312 of the third bank 31. The second row counter 622 may sequentially count the row address signals RA<K:1> from the second initial logic level combination to a second end logic level combination in synchronization with the operation clock signal CLK_SEL, if the counting control pulse CNTP occurs. The second end logic level combination of the row address signals RA<K:1> may correspond to a final word line included in the second area 212 of the first bank 21 or a final word line included in the second area 312 of the third bank 31.

The column counter 63 may output the column address signals CA<P:1> that are counted in response to at least one of the row address signals RA<K:1> and the operation clock signal CLK_SEL. The column counter 63 may sequentially count the column address signals CA<P:1> from a third initial logic level combination to a third end logic level combination for each logic level combination of the row address signals RA<K:1> in synchronization with the operation clock signal CLK_SEL. The third initial logic level combination of the column address signals CA<P:1> may correspond to a first bit line included in the first bank 21 or the third bank 31. A third end logic level combination of the column address signals CA<P:1> may correspond to a final bit line included in the first bank 21 or the third bank 31.

The counting control pulse generation circuit 64 may generate the counting control pulse CNTP in response to the column address signals CA<P:1>. The counting control pulse generation circuit 64 may output the counting control pulse CNTP which is generated if the column address signals CA<P:1> has the third end logic level combination.

Figure 4:
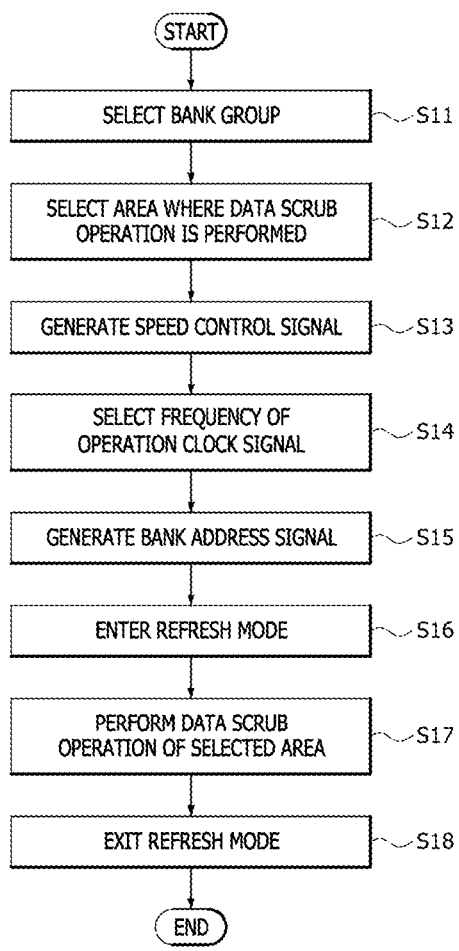
FIG. 4 to FIG. 6 illustrate an operation of the data scrub circuit shown in FIG. 2.

A data scrub operation of the semiconductor device having the aforementioned configuration will be described hereinafter in detail with reference to FIG. 4.

First, a bank group may be selected to perform the data scrub operation according to at least one of the first temperature codes T1<N:1> which are generated by sensing the internal temperature between the first bank 21 and the second bank 22, and the second temperature codes T2<N:1> which are generated by sensing the internal temperature between the third bank 31 and the fourth bank 32 (see a step S11). If the internal temperature corresponding to the first temperature codes T1<N:1> is higher than the internal temperature corresponding to the second temperature codes T2<N:1>, the first bank group 2 may be selected for the data scrub operation. If the internal temperature corresponding to the first temperature codes T1<N:1> is lower than the internal temperature corresponding to the second temperature codes T2<N:1>, the second bank group 3 may be selected for the data scrub operation.

Subsequently, an area may be selected such that the data scrub operation is performed according to the third temperature codes T3<N:1> which are generated by sensing the internal temperature between the first area 211 of the first bank 21 and the first area 311 of the third bank 31, and the fourth temperature codes T4<N:1> which are generated by sensing the internal temperature between the second area 212 of the first bank 21 and the second area 312 of the third bank 31 (see a step S12). If the internal temperature corresponding to the third temperature codes T3<N:1> is higher than the internal temperature corresponding to the fourth temperature codes T4<N:1>, the first area 211 of the first bank 21 and the first area 311 of the third bank 31 may be selected based on a logic level combination of the area selection signal AR_SEL for the data scrub operation. If the internal temperature corresponding to the third temperature codes T3<N:1> is lower than the internal temperature corresponding to the fourth temperature codes T4<N:1>, the second area 212 of the first bank 21 and the second area 312 of the third bank 31 may be selected for the data scrub operation.

Subsequently, the speed control signal VC for selecting a frequency of the operation clock signal CLK_SEL may be generated according to the third temperature codes T3<N:1> and the fourth temperature codes T4<N:1> (see a step S13). If at least one internal temperature corresponding to the third temperature codes T3<N:1> and the internal temperature corresponding to the fourth temperature codes T4<N:1> is equal to or lower than a predetermined internal temperature, the speed control signal VC having a logic low level may be generated. If at least one internal temperature corresponding to the third temperature codes T3<N:1> and the internal temperature corresponding to the fourth temperature codes T4<N:1> is higher than the predetermined internal temperature, the speed control signal VC having a logic high level may be generated.

Subsequently, a frequency of the operation clock signal CLK_SEL may be selected from the clock signal CLK<M:1> according to a logic level of the speed control signal VC (see a step S14). For example, a first bit CLK<1> (having a first frequency) of the clock signal may be selected and outputted as the operation clock signal CLK_SEL if the speed control signal VC has a logic low level, and a second bit CLK<2> (having a second frequency) of the clock signal may be selected and outputted as the operation clock signal CLK_SEL if the speed control signal VC has a logic high level.

Subsequently, the bank address signals BA<J:1> may be generated according to logic levels of the bank information BGMR and the bank group selection signal BG_SEL (see a step S15). For example, if the bank information BGMR has a logic high level and the bank group selection signal BG_SEL has a logic low level, the bank address signals BA<J:1> corresponding to the first bank 21 included in the first bank group 2 may be generated. If both the bank information BGMR and the bank group selection signal BG_SEL have a logic high level, the bank address signals BA<J:1> corresponding to the third bank 31 included in the second bank group 3 may be generated.

If the refresh signal REF is enabled, the semiconductor device may enter a refresh mode (see a step S16).

The data scrub operation on an area selected according to a logic level of the area selection signal AR_SEL may be performed in the refresh mode (see a step S17). If the area selection signal AR_SEL has a logic low level, the row address signals RA<K:1> and the column address signals CA<P:1> corresponding to the first area 211 of the first bank 21 or the first area 311 of the third bank 31 may be generated to perform the data scrub operation for cells included in the first area 211 of the first bank 21 or the first area 311 of the third bank 31. The data scrub operation may be repeatedly performed for all of the cells included in the first area 211 of the first bank 21 or the first area 311 of the third bank 31. If the area selection signal AR_SEL has a logic high level, the row address signals RA<K:1> and the column address signals CA<P:1> corresponding to the second area 212 of the first bank 21 or the second area 312 of the third bank 31 may be generated to perform the data scrub operation for cells included in the second area 212 of the first bank 21 or the second area 312 of the third bank 31. The data scrub operation may be repeatedly performed for all of the cells included in the second area 212 of the first bank 21 or the second area 312 of the third bank 31.

If the refresh signal REF is disabled, the semiconductor device may exit the refresh mode to terminate the data scrub operation (see a step S18).

The data scrub operation will be described more fully hereinafter with reference to FIG. 5 and FIG. 6.

Figure 5:
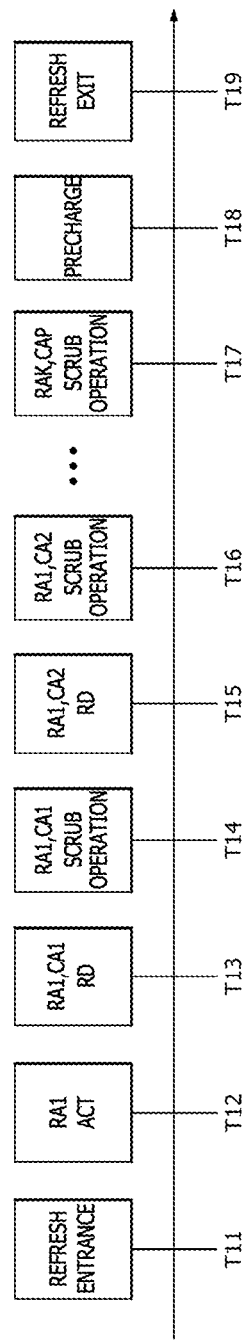

As illustrated in FIG. 5, if the semiconductor device enters the refresh mode at a point of time T11, a first logic level combination RA1 of the row address signals RA<K:1> may be generated to perform an active operation on a cell which is accessed by the first logic level combination RA1 of the row address signals RA<K:1> at a point of time T12. If a first logic level combination CA1 of the column address signals CA<P:1> is generated at a point of time T13, a read operation may be performed for a cell which is accessed by the first logic level combination RA1 of the row address signals RA<K:1> and the first logic level combination CA1 of the column address signals CA<P:1>. If an error is detected in data which is read by the read operation at a point of time T14, the data scrub operation may be performed for the cell which is accessed by the first logic level combination RA1 of the row address signals RA<K:1> and the first logic level combination CA1 of the column address signals CA<P:1>. If a second logic level combination CA2 of the column address signals CA<P:1> is generated at a point of time T15, a read operation may be performed for a cell which is accessed by the first logic level combination RA1 of the row address signals RA<K:1> and the second logic level combination CA2 of the column address signals CA<P:1>. If an error is detected in data which is read by the read operation at a point of time T16, the data scrub operation may be performed for the cell which is accessed by the first logic level combination RA1 of the row address signals RA<K:1> and the second logic level combination CA2 of the column address signals CA<P:1>. The data scrub operation for the selected area may be repeatedly performed until a point of time T17. If the data scrub operation for all of the cells included in the selected area is achieved at a point of time T18, a precharge operation may be performed and the semiconductor device may exit the refresh mode at a point of time T19.

Figure 6:
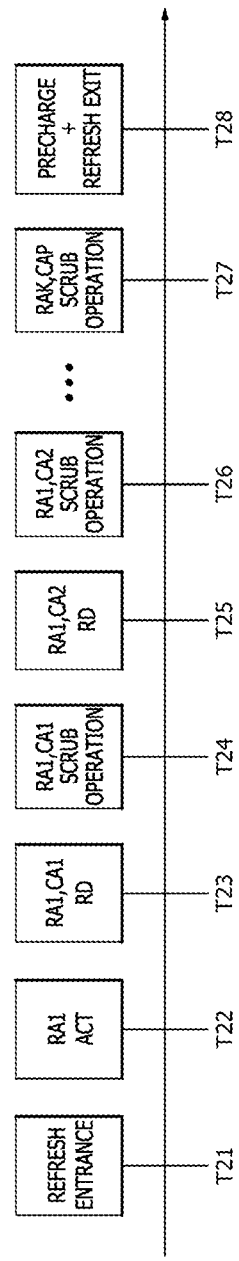

As illustrated in FIG. 6, if the semiconductor device enters the refresh mode at a point of time T21, the first logic level combination RA1 of the row address signals RA<K:1> may be generated to perform the active operation on a cell which is accessed by the first logic level combination RA1 of the row address signals RA<K:1> at a point of time T22. If the first logic level combination CA1 of the column address signals CA<P:1> is generated at a point of time T23, the read operation may be performed for a cell which is accessed by the first logic level combination RA1 of the row address signals RA<K:1> and the first logic level combination CA1 of the column address signals CA<P:1>. If an error is detected in data which is read by the read operation at a point of time T24, the data scrub operation may be performed for the cell which is accessed by the first logic level combination RA1 of the row address signals RA<K:1> and the first logic level combination CA1 of the column address signals CA<P:1>. If the second logic level combination CA2 of the column address signals CA<P:1> is generated at a point of time T25, the read operation may be performed for a cell which is accessed by the first logic level combination RA1 of the row address signals RA<K:1> and the second logic level combination CA2 of the column address signals CA<P:1>. If an error is detected in data which is read by the read operation at a point of time T26, the data scrub operation may be performed for the cell which is accessed by the first logic level combination RA1 of the row address signals RA<K:1> and the second logic level combination CA2 of the column address signals CA<P:1>. The data scrub operation for the selected area may be repeatedly performed until a point of time T27. If the data scrub operation is achieved for all of the cells included in the selected area at a time T28, the precharge operation may be performed and the semiconductor device may exit the refresh mode.

Figure 7:
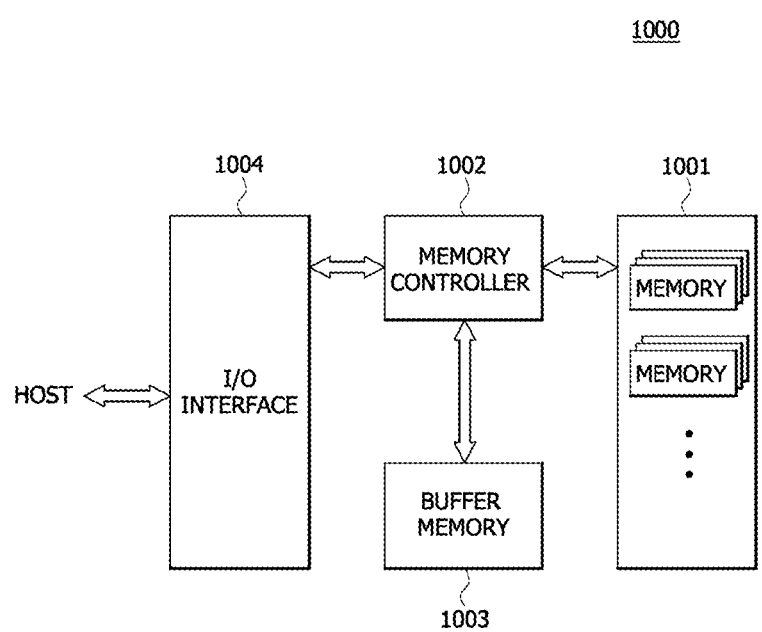
FIG. 7 and FIG. 8 are block diagrams illustrating configurations of electronic systems employing the semiconductor device of FIG. 1.

The semiconductor device illustrated in FIG. 1 may be applied to an electronic system that includes a memory system, a graphic system, a computing system, a mobile system, or the like. For example, as illustrated in FIG. 7, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device 1 illustrated in FIG. 1. Meanwhile, the data storage circuit 1001 may include a nonvolatile memory that can retain stored data, even if the power supply of the data storage circuit 1001 is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003, or for outputting the data stored in the data storage circuit 1001 or the buffer memory 1003. Although FIG. 7 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or inputted to the data storage circuit 1001. The buffer memory 1003 may store the data which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 8:
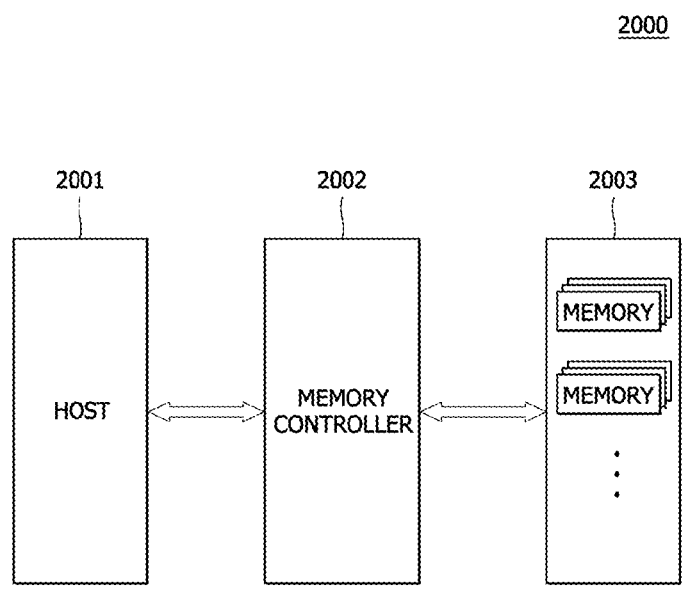

Referring to FIG. 8, an electronic system 2000 according to another embodiment of the present disclosure may include a host 2001, a memory controller 2002, and a data storage circuit 2003.

The host 2001 may output a request signal and data to the memory controller 2002 to access the data storage circuit 2003. The memory controller 2002 may supply the data, a data strobe signal, a command, addresses, and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses, and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the semiconductor device 1 illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

According to the present disclosure, internal temperatures of various areas in a semiconductor device may be sensed, and a data scrub operation may be performed for an area of the semiconductor device having a relatively high temperature. Accordingly, data loss of the semiconductor device may be reduced.

What is claimed is:

1. A semiconductor device comprising:
   a bank address generation circuit configured to generate a bank address signal according to a bank group selection signal which is generated in response to a first temperature code and a second temperature code;
   a row/column address generation circuit configured to generate a row address signal and a column address signal according to an area selection signal which is generated in response to a third temperature code and a fourth temperature code; and an operation control circuit configured to perform a data scrub operation on a cell which is accessed by the bank address signal, the row address signal, and the column address signal, wherein the row/column address generation circuit outputs the row address signal and the column address signal in which each are counted in synchronization with an operation clock signal whose frequency is determined in response to the third temperature code and the fourth temperature code.

2. The device of claim 1,
wherein the first temperature code is generated by sensing an internal temperature of a first bank group; and
wherein the second temperature code is generated by sensing an internal temperature of a second bank group.

3. The device of claim 2, wherein the bank group selection signal has a logic level combination for selecting the first bank group, if an internal temperature corresponding to the first temperature code is higher than an internal temperature corresponding to the second temperature code.

4. The device of claim 1, wherein the bank address generation circuit is configured to generate the bank address signal corresponding to a cell included in a first bank group or a second bank group in response to a bank information or to generate the bank address signal corresponding to a cell included in a first bank of the first bank group or a cell included in a second bank of the second bank group in response to the bank information.

5. The device of claim 1,
further comprising a first bank, a second bank, a first temperature sensor and a second temperature sensor,
wherein the first bank is divided into a first area and a second area;
wherein the second bank is divided into a third area and a fourth area;
wherein the first temperature sensor is disposed between the first area and the third area to generate the third temperature code; and
wherein the second temperature sensor is disposed between the second area and the fourth area to generate the fourth temperature code.

6. The device of claim 5, wherein the area selection signal has a logic level combination for selecting the first area of the first bank and the third area of the second bank, if an internal temperature corresponding to the third temperature code is higher than an internal temperature corresponding to the fourth temperature code.

7. The device of claim 1,
wherein the frequency of the operation clock signal is determined to be a first frequency if at least one of an internal temperature corresponding to the third temperature code and an internal temperature corresponding to the fourth temperature code is equal to or lower than a predetermined internal temperature; and
wherein the frequency of the operation clock signal is determined to be a second frequency if at least one of the internal temperature corresponding to the third temperature code and the internal temperature corresponding to the fourth temperature code is higher than the predetermined internal temperature.

8. The device of claim 1, wherein the row/column address generation circuit generates the row address signal and the column address signal in response to a refresh signal.

9. The device of claim 1, wherein the row/column address generation circuit includes:

a counter start signal generation circuit configured to generate a first counter start signal and a second counter start signal in response to a refresh signal and the area selection signal; and
a row counter circuit configured to output the row address signal that is counted in response to the first counter start signal and the second counter start signal.

10. The device of claim 9,
wherein the row counter circuit includes a first row counter and a second row counter;
wherein the first row counter sets a logic level combination of the row address signal to a first initial logic level combination in synchronization with a point of time that the first counter start signal is enabled, and the first row counter counts the row address signal from the first initial logic level combination to a first end logic level combination in response to a counting control pulse; and
wherein the second row counter sets a logic level combination of the row address signal to a second initial logic level combination in synchronization with a point of time that the second counter start signal is enabled, and the second row counter counts the row address signal from the second initial logic level combination to a second end logic level combination in response to the counting control pulse.

11. The device of claim 9, wherein the row/column address generation circuit further includes a column counter which is configured to output the column address signal that is counted for each logic level combination of the row address signal.

12. The device of claim 11, wherein the row/column address generation circuit further includes a counting control pulse generation circuit which is configured to generate a counting control pulse if the column address signal is counted to have an end logic level combination.

13. A semiconductor device comprising:
a row/column address generation circuit configured to generate a row address signal and a column address signal according to an area selection signal which is generated in response to a first temperature code and a second temperature code and according to a refresh signal; and
an operation control circuit configured to perform a data scrub operation on a cell which is accessed by a bank address signal, the row address signal, and the column address signal, wherein the row/column address generation circuit outputs the row address signal and the column address signal in which each are counted in synchronization with an operation clock signal whose frequency is determined in response to the first temperature code and the second temperature code.

14. The device of claim 13,
further comprising a first bank, a second bank, a first temperature sensor and a second temperature sensor,
wherein the first bank is divided into a first area and a second area;
wherein the second bank is divided into a third area and a fourth area;
wherein the first temperature sensor is disposed between the first area and the third area to generate the third temperature code; and
wherein the second temperature sensor is disposed between the second area and the fourth area to generate the fourth temperature code.

15. The device of claim 14, wherein the area selection signal has a logic level combination for selecting the first area of the first bank and the third area of the second bank, if an internal temperature corresponding to the first temperature code is higher than an internal temperature corresponding to the second temperature code.

16. The device of claim 13, wherein the row/column address generation circuit includes:
   a counter start signal generation circuit configured to generate a first counter start signal and a second counter start signal in response to the refresh signal and the area selection signal; and
   a row counter circuit configured to output the row address signal that is counted in response to the first counter start signal and the second counter start signal.

17. The device of claim 16, wherein the row/column address generation circuit further includes:
   a column counter configured to output the column address signal that is counted for each logic level combination of the row address signal; and
   a counting control pulse generation circuit configured to generate a counting control pulse if the column address signal is counted to have an end logic level combination.

* * * * *